United States Patent [19]

Powers et al.

[11] Patent Number: 5,225,691
[45] Date of Patent: Jul. 6, 1993

[54] SEMICONDUCTOR WAFER CASSETTE MAPPER WITH EMITTER AND DETECTOR ARRAYS FOR SLOT INTERROGATION

[75] Inventors: Lyle R. Powers, Boulder; Rikk Crill, Longmont, both of Colo.

[73] Assignee: Avalon Engineering, Inc., Boulder, Colo.

[21] Appl. No.: 885,116

[22] Filed: May 18, 1992

[51] Int. Cl.$^5$ .............................................. G01N 21/86
[52] U.S. Cl. ................................ 250/561; 250/223 R; 414/331
[58] Field of Search ............... 250/222.1, 223 R, 561, 250/221; 356/400, 401; 414/331, 274

[56] References Cited

U.S. PATENT DOCUMENTS

| 4,786,816 | 11/1988 | Ohmori et al. | 250/561 |
| 4,803,373 | 2/1989 | Imamura et al. | 414/331 |

Primary Examiner—David C. Nelms
Attorney, Agent, or Firm—William E. Hein

[57] ABSTRACT

A semiconductor wafer cassette mapper detects the presence absence of a semiconductor wafer in a particular corresponding pair of slots of the wafer cassette, as well as a cross slotted condition in which a wafer is not aligned in a corresponding pair of slots. The wafer cassette mapper includes a base member for receiving a standard slotted wafer cassette, the base member including transmitter and receiver modules on opposite sides thereof. The transmitter and receiver modules include like pluralities of inwardly facing, aligned light apertures. Each of the light apertures in the transmitter module contains a light emitting infrared transmitter, and each of the light apertures in the receiver module contains an infrared receiver. Control circuitry selectively activates the light emitting transmitters for a predetermined period of time and selectively interrogates the infrared receivers during that period of time to determine if a particular receiver has received light transmitted by a selected transmitter. Logic circuitry then processes this information to determine if a particular wafer position is empty and if a cross slotted condition exists.

7 Claims, 3 Drawing Sheets

FIG.4A NO WAFER PRESENT
R1 RECEIVES T1 & T2
R2 RECEIVES T1 & T2

WAFER PRESENT
R1 RECEIVES T1 BUT NOT T2
R2 RECEIVES T2 BUT NOT T1

CROSS SLOTTED WAFER
R1 RECEIVES T1 & T2
R2 RECEIVES NEITHER

SEMICONDUCTOR WAFER CASSETTE MAPPER WITH EMITTER AND DETECTOR ARRAYS FOR SLOT INTERROGATION

BACKGROUND AND SUMMARY OF THE INVENTION

This invention relates generally to semiconductor processing and more particularly to industry standard wafer cassettes that are employed to hold twenty-five standard silicon or gallium arsenide wafers of a certain diameter. The semiconductor industry uses these thin, very fragile silicon or gallium arsenide wafers that are typically 4, 5, 6 or 8 inches in diameter on which to fabricate integrated circuits. More than $100,000 worth of packaged integrated circuits may be fabricated on a single one of these wafers. It is therefore extremely important to prevent damage to the fragile wafers on which as many as 300 separate manufacturing processes may be performed before the wafer is cut into separate dies for final packaging. Several types of wafer cassettes are used to hold these wafers, depending on the particular process being performed. For example, teflon cassettes are typically employed to hold the wafers while they are in chemical prosesses, ABS plastic traveller cassettes are employed to transport wafers from one processes to the next, and quartz cassettes are employed to retain wafers during high temperature processes. The processing equipment required to manufacture integrated circuits is very expensive; so any increase in manufacturing speed and yield is highly desirable.

In order to increase manufacturing speed and reliability, loading and unloading robots are used to transfer the wafers from one cassette to another. However, wafers are sometimes loaded into incoming cassettes by hand, typically from manual inspection stages. Manual loading of cassettes presents the opportunity for creating a disastrous condition known as cross slotting. This condition occurs when a wafer is not loaded into corresponding slots on each side of the cassette, resulting in one side of a loaded wafer being higher than the other side, rather than the wafer being in a perfectly horizontal position. When a cross slotted wafer is presented to the pickup arm of a robot, the arm jams one side of the fragile wafer, thereby not only destroying that wafer but also damaging other wafers in the cassette as the result of contamination of those otherwise good wafers by the pieces of the shattered wafer.

An additional problem is presented in prior art cassette handling systems when a cassette coming into a robot stage is only partially filled with wafers. The robot assumes that every slot of a cassette contains a wafer and is therefore designed to traverse each of the twenty-five slot positions of the cassette and to attempt to pick a wafer from each slot position. In the case of wafer cassettes that are not completely filled, valuable time is wasted as the robot searches unfilled wafer positions.

Several attempt have been made in the prior art to provide wafer detection systems. One such prior art system is based on non-inductive proximity detection, since wafers are not ferromagnetic. In this type of system, a capacitive field effect sensor is mounted on the robot arm to detect the presence or absence of a wafer in each slot position of a cassette. These wafer detection systems suffer from long traverse times and, more importantly, make no provision for cross slotted wafers.

Another known wafer detection system employs a video camera in which a small video head is remotely mounted on the robot arm. A video framegrabber and analysis software are integrated with the robot controller. The images obtained by the remote head video camera ar used to detect the presence or absence of a wafer in each slot position of a cassette. These video camera systems are expensive, and, like the proximity detectors described above, have no capability for detecting cross slotted wafers.

It is therefore a principal object of the present invention to provide a semiconductor wafer cassette mapper that is capable of rapidly and accurately providing information representative of the presence or absence of a wafer in each slot of a wafer cassette, thereby eliminating the need for a robot wafer handler to individually traverse each of the slots in order to make that determination.

It is a further object of the present invention to provide a semiconductor wafer cassette mapper that detects cross slotted wafers, thereby eliminating the risk of damage to a a cross slotted wafer, other wafers in the cassette, the cassette itself, and the clean room environment generally, that would otherwise result from attempted retrieval of the cross slotted wafer by the arm of a robot wafer handler.

These and other objects are accomplished in accordance with the illustrated preferred embodiment of the present invention by providing a base member for receiving a standard slotted wafer cassette, the base member including transmitter and receiver modules on opposite sides thereof. The transmitter and receiver modules include like pluralities of inwardly facing, aligned light apertures. Each of the light apertures in the transmitter module contains a light emitting infrared transmitter, and each of the light apertures in the receiver module contains an infrared receiver. Control circuitry selectively activates the light emitting transmitters for a predetermined period of time and selectively interrogates the infrared receivers during that period of time to determine if a particular receiver has received light transmitted by a selected transmitter. This information is then processed by logic circuitry to determine the presence or absence of a semiconductor wafer in a particular corresponding pair of slots of the wafer cassette and to detect the existence of cross slotted condition in which a particular semiconductor wafer is not aligned in a corresponding pair of slots of the wafer cassette. Several wafer cassette mappers may be connected in a system configuration to serve a semiconductor fabrication process. In such a system configuration, an external host computer is employed to control the various wafer cassette mappers and to enable the user to request cassette map information from selected ones of the wafer cassette mappers and to generate a visual display or hard copy of the requested cassette map information.

BRIEF DESCRIPTION OF THE DRAWINGS

FIGS. 4A-C are light beam trace diagrams of the light beam logic employed in the semiconductor wafer cassette mapper of FIGS. 1-3 to detect the presence or absence of a wafer in a particular slot of the cassette and to detect a cross slotting condition in which a particular wafer is not horizontally aligned in corresponding slots on opposite sides of the cassette.

DETAILED DESCRIPTION OF THE PREFERRED EMBODIMENT

Figure 1:
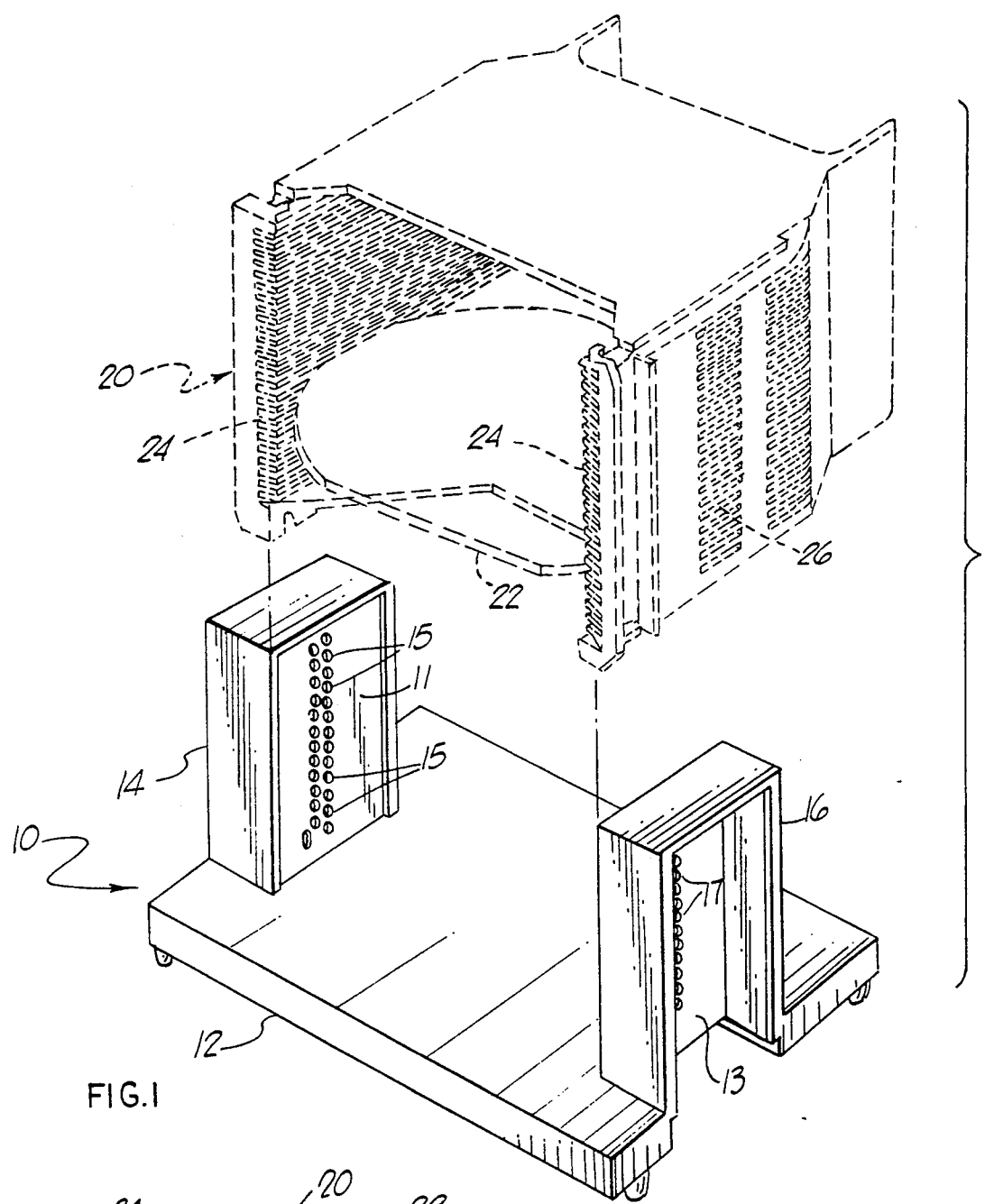
FIG. 1 is a pictorial diagram illustrating the semiconductor wafer cassette mapper of the present invention and the way in which a standard wafer cassette is inserted therein and removed therefrom.
Figure 2:
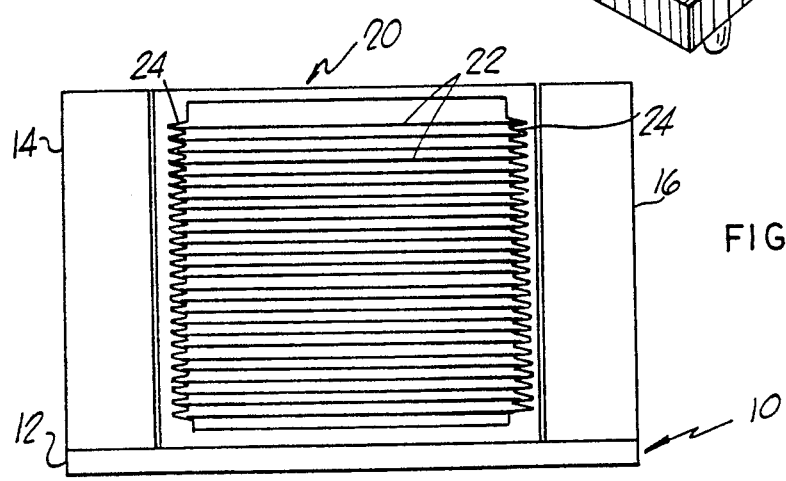
FIG. 2 is a front view of the the semiconductor wafer cassette mapper of FIG. 1 with a standard wafer cassette positioned therein.

Referring now to the pictorial diagrams of FIGS. 1 and 2, there is shown the semiconductor wafer cassette mapper 10 of the present invention and an industry standard cassette 20 capable of holding a full complement of twenty-five wafers 22. Each of the wafers 22 is positioned horizontally within cassette 20 in corresponding evenly-spaced slots 24 located along each side of cassette 20. Semiconductor wafer cassette mapper 10 comprises a base member 12 that supports a transmitter housing 14 on one side thereof and a receiver housing 16 on the opposite side thereof. Cassette 20 is arranged for downward engagement with semiconductor wafer cassette mapper 10 between transmitter and receiver modules 14, 16 and for upward disengagement therefrom. Transmitter housing 14 and receiver housing 16 each include inwardly facing plates 11, 13 that contain a plurality of light apertures 15, 17. Each of the plurality of light apertures 17 is aligned with a corresponding one of the slots 24 that appears in a slot window 26 on one side of cassette 20. Similarly, each of the plurality of light apertures 15 is aligned with a corresponding one of the slots 24 that appears in a slot window corresponding to slot window 26 on the opposite side of cassette 20. Transmitter housing 14 and receiver housing 16 are preferably fabricated of a material such as aluminum or delrin and are machined to have smooth outer surfaces to thereby minimize the attraction of airborne particles in order to maintain a clean room environment. Each of plates 11, 13 of the transmitter and receiver housings 14, 16 is preferably covered with an infrared filter to minimize the impingement of ambient infrared light on light apertures 15, 17.

Figure 3:
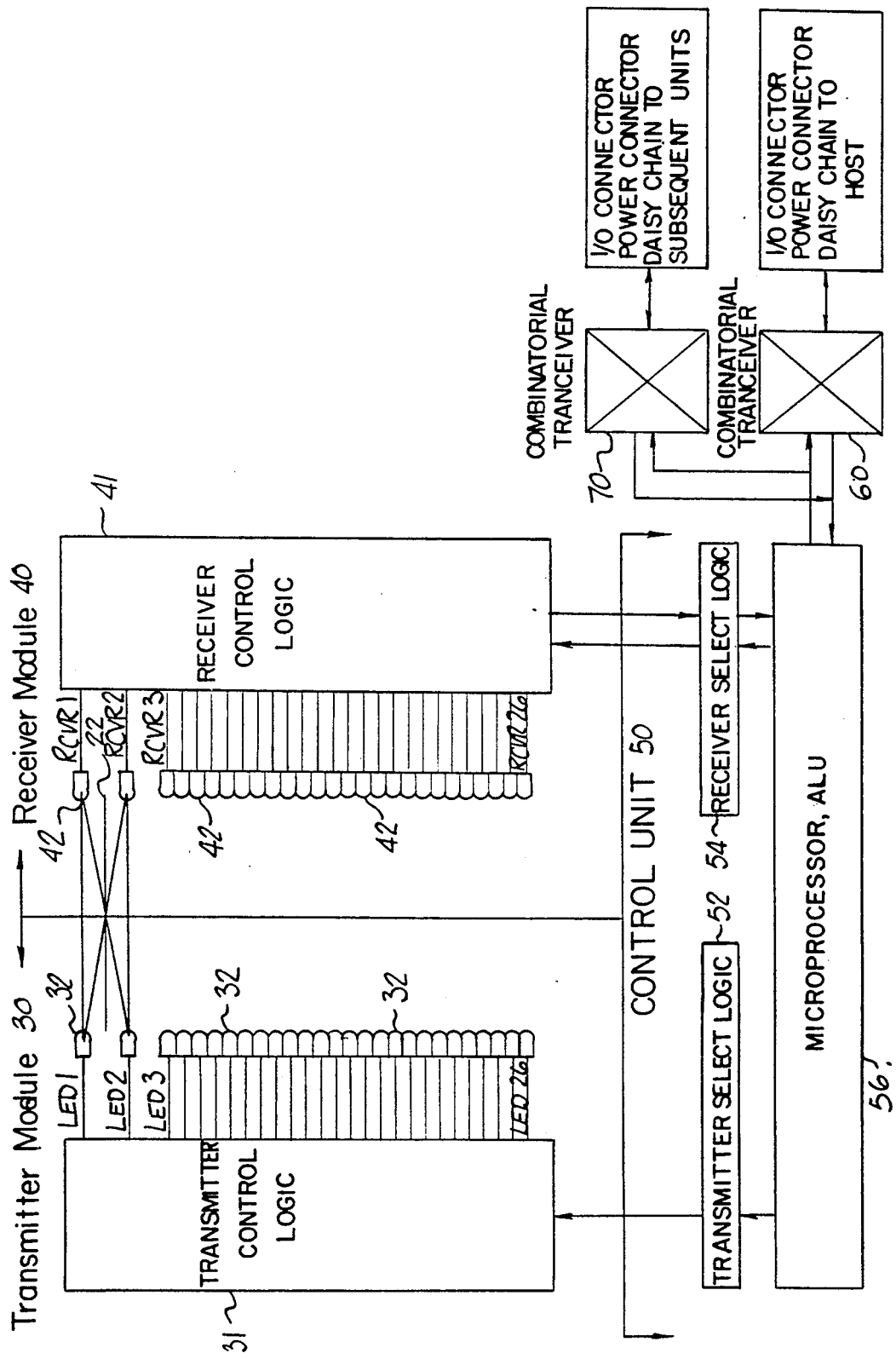
FIG. 3 is a block diagram of the electronic circuitry employed in the semiconductor wafer cassette mapper of FIGS. 1 and 2.

Referring now to FIG. 3, there is shown a block diagram of circuitry employed in the semiconductor wafer cassette mapper 10 of the present invention. A transmitter module 30 includes conventional transmitter control logic 31 for controlling an array of infrared light emitting transmitter diodes 32. Twenty-six transmitter diodes 32 are required if a standard cassette capable of holding twenty-five wafers is employed with the semiconductor wafer cassette mapper 10. The transmitter diodes 32 are positioned in the light apertures 15 of transmitter housing 14, illustrated in FIG. 1, such that each of the wafers 22 contained within cassette 20 has one of the transmitter diodes 32 above it and an adjacent one of the transmitter diodes 32 below it. The transmitter control logic 31 operates to control the current to each of the transmitter diodes 32, thereby permitting the intensity of the infrared light emitted therefrom to be varied over a wide range. The duty cycle of the current supplied to each of the transmitter diodes 32 is considerably less than 1% to allow large peak currents to flow in each diode without exceeding its average power rating. Each of the transmitter diodes 32 has a small beam angle on the order of 15 degrees, thereby concentrating the emitted light in a small area.

Similarly, a receiver module 40 includes an array of twenty-six infrared photo detectors or receivers 42 that are controlled by conventional receiver control logic 41. Receivers 42 ar positioned in the light apertures 17 of the receiver housing 16, illustrated in FIG. 1, in correspondence with the positions of the array of transmitter diodes 32. Each of the receivers 42 is capable of detecting light from the corresponding one of transmitter diodes 32, as well as from the one of transmitter diodes 32 directly above and directly below the corresponding one of transmitter diodes 32.

A control unit 50 is coupled to transmitter control logic 31 and receiver control logic 41. Control unit 50 includes transmitter select logic 52, receiver select logic 54, and a microprocessor 56. Control unit 50 operates to turn on each of the transmitter diodes 32 in sequence and to read the state of each of the receivers 42 during the time that a particular one of the transmitter diodes 32 is turned on. A program executed by microprocessor 56 computes a current map containing information representative of the presence or absence of a wafer 22 in each one of the twenty-five slots 24 in cassette 20, as well as information representative of the existence of a cross slotting condition. A combinatorial transceiver 60 is coupled to microprocessor 56 and is operative for communicating requests from a external host computer for a cassette map and for in turn communicating the information comprising the cassette map back to the host computer. Another combinatorial transceiver 70, also coupled to microprocessor 56, operates to provide communication between additional semiconductor wafer cassette mappers that may be connected in a daisy chain arrangement to permit a single host computer to control a number of semiconductor wafer cassette mappers employed in a semiconductor fabrication process. In such an arrangement, each of the multiple semiconductor wafer cassette mappers is associated with a particular address, by which it is then accessed by the host computer.

Figure 4B:
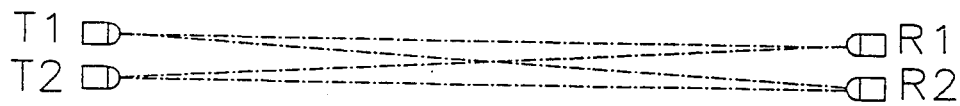
Figure 4B:
Figure 4C:

In operation, as explained above, each of the transmitter diodes 32 is turned on in sequence for a predetermined period of time. During that period of time, the state of each of the receivers 42 is read and stored in microprocessor 56 of control unit 50. Analysis of the stored information is then performed by microprocessor 56 to determine the presence or absence of a wafer in each of the slots 24 of cassette 20 and to also determine the existence of a cross slotting condition. This analysis is performed in accordance with the logic conditions illustrated in the light beam trace diagrams of FIGS. 4A-C. In the event no wafer is present in a particular corresponding pair of slots in cassette 20, as illustrated in FIG. 4A, the receiver R1 that is positioned immediately above the corresponding pair of slots in question will detect the light beams emitted from both transmitter diodes T1 and T2, and the receiver R2 that is positioned immediately below the corresponding pair of slots in question will also detect the light beams emitted from both transmitter diodes T1 and T2. This information is coded as a single character denoting the absence of a wafer in the corresponding pair of slots in question and is stored in control unit 50. In the event a wafer 22 is present in a particular corresponding pair of slots in cassette 20, as illustrated in FIG. 4B, the receiver R1 that is positioned immediately above the corresponding pair of slots in question will detect the light beam emitted from transmitter diode TI that is positioned immediately above the corresponding pair of slots in question but will not detect the light beam emitted from transmitter diode T2 that is positioned immediately below the corresponding pair of slots in question. Similarly, the receiver R2 that is positioned immediately below the corresponding pair of slots in question will detect the light beam emitted from transmitter diode T2 but will not detect the light beam emitted from transmitter diode T1. This information is also coded as a single character denoting the presence of a wafer in the corresponding pair of slots in question and is also stored in control unit 50. Finally, in the event a wafer has been positioned in cassette 20 in a cross slotted condition in which it does not reside in a corresponding pair of slots in cassette 20, as illustrated in FIG. 4C, the receiver R1 will detect the light beams emitted from both of the transmitter diodes T1 and T2. However, the receiver R2 will not detect the light beams emitted from either of the transmitter diodes T1 and T2. Several other cross slotting conditions similar to that illustrated in FIG. 4C may be presented. Each such cross slotting condition will result in a different data pattern read from receivers 42. Each one of these different data patterns may be coded to indicate the exact orientation of the cross slotted wafer, or they may all be coded as a single character stored in control unit 50 to generally indicate a cross slotting condition. In practice, the latter procedure is preferable, because user intervention is required to correct all types of cross slotted conditions in order to avoid the possibility of damage to the wafer by a robot wafer handler.

We claim:

1. A semiconductor wafer cassette mapper for detecting the presence or absence of a semiconductor wafer in each of a plurality of corresponding pairs of slots along opposite sides of a wafer cassette, the wafer cassette mapper comprising:

a base member for supporting a wafer cassette having a plurality of corresponding evenly-spaced slots located along opposite sides of the wafer cassette, each of the corresponding evenly-spaced slots being adapted to receive and retain a single semiconductor wafer, the base member including transmitter and receiver housings positioned on opposite sides of said wafer cassette, the transmitter and receiver housings each including a plurality of inwardly facing light apertures, each of the plurality of light apertures included within the transmitter housing being aligned with a corresponding one of the plurality of light apertures included within the receiver housing and being associated with a corresponding one of the slots in the wafer cassette;

a plurality of infrared light emitting transmitters positioned within the plurality of light apertures included within the transmitter housing, each of the infrared light emitting transmitters being operative for generating infrared light when activated;

a plurality of infrared receivers positioned within the plurality of light apertures included within the receiver housing for detecting infrared light emitted by the plurality of infrared light emitting transmitters; and control means, coupled to the plurality of infrared light emitting transmitters and the plurality of infrared receivers, for selectively activating the plurality of light emitting transmitters for a predetermined period of time and for selectively interrogating the plurality of infrared receivers during that period of time to obtain status information therefrom, the control means including logic means responsive to the status information obtained from selected ones of the infrared receivers for determining the presence or absence of a semiconductor wafer in a particular corresponding pair of slots of said wafer cassette.

2. A semiconductor wafer cassette mapper as in claim 1 wherein said logic means is further responsive to the status information obtained from selected ones of the infrared receivers for determining the existence of a cross slotted condition in which a particular semiconductor wafer is not aligned in a corresponding pair of slots of the wafer cassette.

3. A semiconductor wafer cassette mapper as in claim 2 wherein said control means is operative for generating cassette map information representative of the presence or absence of a semiconductor wafer in each of the corresponding pairs of slots of said wafer cassette and information representative of the existence of each cross slotted condition that has been determined.

4. A semiconductor wafer cassette mapper as in claim 3, further comprising:

host computer means for enabling a user to enter a request for said cassette map information and for generating a visual image of said cassette map information; and combinatorial transceiver means, coupled to said control means and to said host computer, for communicating a user request for said cassette map information to said control means and for communicating the requested cassette map information from said control means to said host computer.

5. A semiconductor wafer cassette mapper system comprising a plurality of wafer cassette mappers as in claim 3, further comprising:

host computer means for enabling a user to enter requests for cassette map information from a selected one or more of said plurality of wafer cassette mappers and for generating visual images of the requested cassette map information; and combinatorial transceiver means, coupled to each of the plurality of wafer cassette mappers and to said host computer means, for communicating a user request for cassette map information to a selected one or more of said plurality of wafer cassette mappers and for communicating the requested cassette map information to said host computer means.

6. A method for detecting the presence or absence of a planar semiconductor wafer in a corresponding pair of slots along first and second opposite sides of a wafer cassette, the method comprising the steps of:

providing an infrared light emitting transmitter T1 on a first side of a planar axis of said corresponding pair of slots and proximate said first side of said wafer cassette;

providing an infrared light emitting transmitter T2 on a second side of the planar axis of said corresponding pair of slots and proximate said first side of said wafer cassette;

providing an infrared light receiver R1 proximate the second side of said wafer cassette and in alignment with transmitter T1 such that an axis of alignment of transmitter T1 and receiver R1 is parallel with the planar axis of said corresponding pair of slots;

providing a infrared light receiver R2 proximate the second side of said wafer cassette and in alignment with transmitter T2 such that an axis of alignment of transmitter T2 and receiver R2 is parallel with the planar axis of said corresponding pair of slots;

activating transmitter T1 for a predetermined period of time to produce light emission therefrom;

interrogating receivers R1 and R2 during the time that transmitter T1 is activated to ascertain whether light emitted from transmitter T1 has been received thereby;

activating transmitter T2 for a predetermined period of time to produce light emission therefrom;

interrogating receivers R1 and R2 during the time that transmitter T2 is activated to ascertain whether light emitted from transmitter T2 has been received thereby;

providing an indication of the absence of a semiconductor wafer in said corresponding pair of slots if light emitted from transmitter T1 has been received by both receivers R1 and R2 and if light emitted from transmitter T2 has been received by both receiver R1 and R2; and providing an indication of the presence of a semiconductor wafer in said corresponding pair of slots if receiver R1 has received light emitted from transmitter T1 but not light emitted from transmitter T2 and if receiver R2 has received light emitted from transmitter T2 but not light emitted from transmitter T1.

7. A method for detecting a cross slotted condition in which a planar semiconductor wafer is not positioned in a corresponding pair of slots along opposite sides of a wafer cassette, but rather is positioned in a non-corresponding pair of slots, the method comprising the steps of:

providing an infrared light emitting transmitter T1 on a first side of a planar axis of said corresponding pair of slots and proximate said first side of said wafer cassette;

providing an infrared light emitting transmitter T2 on a second side of the planar axis of said corresponding pair of slots and proximate said first side of said wafer cassette;

providing an infrared light receiver R1 proximate the second side of said wafer cassette and in alignment with transmitter T1 such that an axis of alignment of transmitter T1 and receiver R1 is parallel with the planar axis of said corresponding pair of slots;

providing an infrared light receiver R2 proximate the second side of said wafer cassette and in alignment with transmitter T2 such that an axis of alignment of transmitter T2 and receiver R2 is parallel with the planar axis of said corresponding pair of slots;

activating transmitter T1 for a predetermined period of time to produce light emission therefrom;

interrogating receivers R1 and R2 during the time that transmitter T1 is activated to ascertain whether light emitted from transmitter T1 has been received thereby;

activating transmitter T2 for a predetermined period of time to produce light emission therefrom;

interrogating receivers R1 and R2 during the time that transmitter T2 is activated to ascertain whether light emitted from transmitter T2 has been received thereby;

providing an indication of a cross slotted condition if receiver R1 has received light emitted from both transmitters T1 and T2 and if receiver R2 has not received light emitted from transmitter T1 and also has not received light emitted from tranmitter T2; and providing an indication of a cross slotted condition if receiver R2 has received light emitted from both transmitters T1 and T2 and if receiver R1 has not received light emitted from transmitter T1 and also has not received light emitted from transmitter T2.

* * * * *